United States Patent [19]
Gans et al.

[11] Patent Number: 5,589,797
[45] Date of Patent: Dec. 31, 1996

[54] LOW DISTORTION AMPLIFIER

[75] Inventors: Michael J. Gans, Monmouth Beach; Yu S. Yeh, Freehold, both of N.J.

[73] Assignee: Lucent Technologies Inc., Murray Hill, N.J.

[21] Appl. No.: 534,371

[22] Filed: Sep. 26, 1995

[51] Int. Cl.$^6$ .................................................. H03F 1/26
[52] U.S. Cl. .......................................... 330/149; 330/110
[58] Field of Search ................................. 330/110, 149; 327/119, 346; 333/218

[56] References Cited

U.S. PATENT DOCUMENTS

| 4,157,508 | 6/1979 | Hecken | 330/149 |
|---|---|---|---|
| 4,513,250 | 4/1985 | Harman | 330/149 |
| 4,943,783 | 7/1990 | Nojima | 330/149 |

OTHER PUBLICATIONS

T. Nojima and T. Konno, "Cuber Predistortion Linearizer for Relay Equipment in 800 MHz Band Land Mobile Telehone System", IEEE Transactions on Vehicular Technology, vol. VT–34, No. 4, Nov., 1985, pp. 169–177.

M. Abramowitz and I. A. Stegun, Eds., "Handbook of Mathematical Functions", National Bureau of Standards, Applied Mathematics Series #55, 3rd Printing, Mar. 1965, p. 16, Eq. (3.6.25).

R. J. Westcott, "Investigation of multiple f.m./f.d.m. carriers through a satellite t.w.t. operating near to saturation", IEE. vol. 114, No. 6, Jun. 1967, pp. 726–740.

*Primary Examiner*—Steven Mottola

[57] ABSTRACT

Disclosed is a low distortion amplifier circuit of the predistortion type that employs a cuber circuit in the predistortion path to provide optimized signal energy at third order intermodulation frequencies, which cancels IMD products generated by the main power amplifier. The cuber circuit employs a pair of anti-parallel diodes that are biased with at least one D.C. source to produce a D.C. current flow through each diode. The input signal applied to the cuber circuit produces signal current flow in each diode to enable a third order output current to be extracted. A desired amount of third order power is thereby provided to realize minimal IMD power in the main amplifier output over a wide dynamic range of the input signal. Using a circuit analysis based on a power series approach, circuit parameters of the cuber circuit can be optimized to provide a desired amount of cancellation of third order IMD products in the main amplifier, without generating excessive higher order power, over an optimized dynamic range of the input signal.

20 Claims, 9 Drawing Sheets

LOW DISTORTION AMPLIFIER

FIELD OF THE INVENTION

The present invention relates to a low distortion amplifier circuit of the predistortion type. More particularly, it relates to an amplifier circuit particularly useful for amplifying a multi-tone input signal, and which uses a cuber circuit to provide third order distortion energy that cancels corresponding energy in a main power amplifier, so as to provide a distortion free output.

BACKGROUND OF THE INVENTION

When a multi-tone signal is amplified, as is the case in a wide variety of applications, undesirable intermodulation distortion (IMD) products are inherently produced, resulting in distortion of the amplified output signal. These IMD products are particularly troublesome in wireless communications applications where signals of several frequency channels are often amplified by a common amplifier. Without proper reduction of the IMD products, signal interference between adjacent channels or within a single channel can become excessively high.

In order to achieve low intermodulation distortion, the amplifier typically has to be backed off from its thermally rated average power output and linearized. In wireless applications, both of these approaches add significantly to the high cost of the transmitting amplifier.

RF amplifiers have been linearized in the past via the use of either predistortion or feed-forward methods of canceling intermodulation. Feed forward amplifier circuits typically employ a main amplifier which produces fundamental and unwanted IMD power, along with a correction amplifier to produce only IMD power. The IMD power of the two amplifiers are then cancelled in an output combiner. While this feed-forward technique is satisfactory for some systems, it is very expensive and requires critical alignment. An example of a feed-forward, low distortion amplifier can be found in U.S. Pat. No. 5,304,945 entitled "Low-Distortion Feed-Forward Amplifier", which is assigned to the assignee herein.

Predistortion methods to reduce IMD have also been utilized in the prior art. In a predistortion amplifier circuit, the input signal is split into two paths: a direct path and a predistorter path. In the predistorter path, the input signal is conditioned in some manner to produce a predistorter signal that contains some signal energy at IMD frequencies. This predistortion signal is then combined with the signal in the direct path, and the combined signal applied to a main amplifier. The output signal of the main amplifier then will have less distortion than it would without the predistorter signal, provided that the amplitude and phase of the predistorter signal is properly selected.

An example of a prior art predistortion amplifier can be found in U.S. Pat. No. 4,157,508 entitled "Signal Cuber Circuit". The amplifier circuit in this patent utilizes a pair of anti-parallel diodes in the predistorter path to generate signal energy at the IMD frequencies. This diode arrangement creates a "cuber"—i.e., a circuit which produces signals at the third order IMD frequencies. The cuber disclosed therein used a balance bridge to minimize the signal leak-through at the fundamental frequencies, and an additional resistor to minimize the 5th order distortion in the cuber output. However, for signal-to-noise (SNR) considerations, diodes with large reverse saturation current had to be used, with associated large junction capacitance. This choice limited the frequency response of the diodes, thus preventing that cuber's use at high frequencies such as in standard cellular telephone bands.

SUMMARY OF THE INVENTION

In one embodiment of the present invention, a low distortion amplifier circuit of the predistortion type employs a cuber circuit in a predistortion path to provide optimized signal energy at third order intermodulation frequencies, which cancels IMD products generated by the main power amplifier. The cuber circuit employs a pair of anti-parallel diodes that are biased with at least one D.C. source to produce a D.C. current flow through each diode. The input signal applied to the cuber circuit produces signal current flow in each diode to enable a third order output current to be extracted via a load impedance. A desired amount of third order power is thereby provided to realize minimal IMD power in the main amplifier output signal, over a wide dynamic range of the input signal.

Using a circuit analysis based on a power series approximation, circuit parameters of the cuber circuit can be optimized to provide a desired amount of cancellation of third order IMD products in the main amplifier, without generating excessive higher order power, over an optimized dynamic range of the input signal.

Preferably, a variable gain low noise amplifier (LNA) is employed in the predistorter path following the cuber circuit to further optimize the third order predistortion power level. A correction feedback loop may then be employed to detect the unwanted IMD power in the main amplifier output signal, to control the LNA gain in accordance with the IMD power detected. Optionally, the feedback loop uses a dither tone generator in conjunction with a multiplier, an integrator and a summing circuit to provide continuous adjustment.

BRIEF DESCRIPTION OF THE FIGURES

For a full understanding of the present invention, reference is had to an exemplary embodiment thereof, considered in conjunction with the accompanying drawings wherein like reference numerals depict like features, for which.

DETAILED DESCRIPTION OF THE INVENTION

Figure 1:
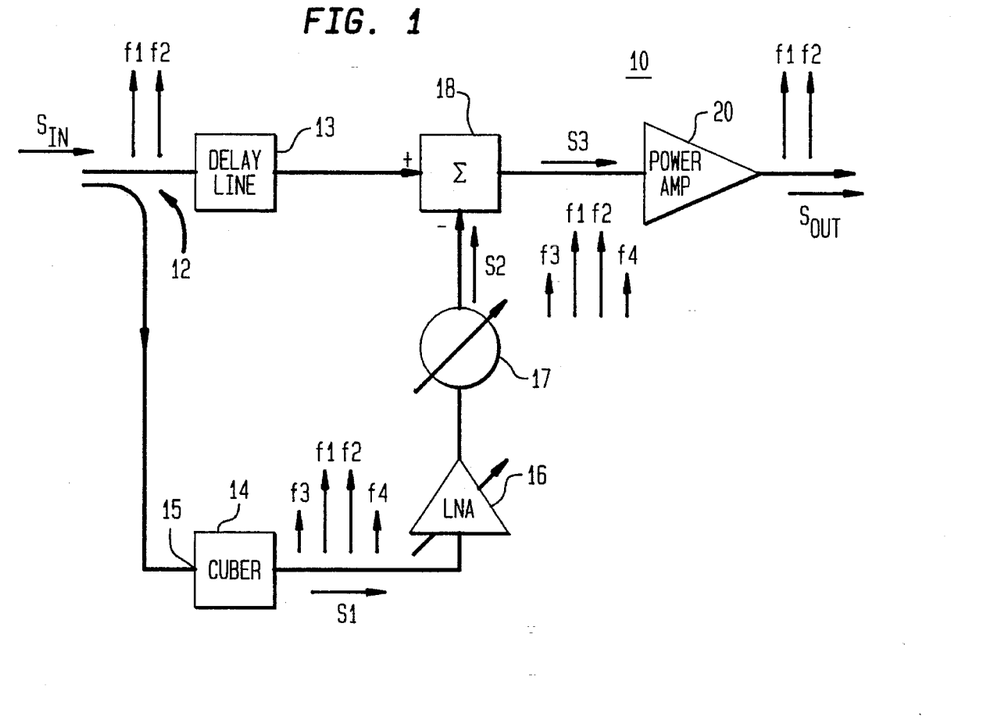
FIG. 1 shows an embodiment of a low distortion amplifier circuit of the present invention.

Referring to FIG. 1, there is shown a predistortion power amplifier circuit 10 according to one embodiment of the present invention. By way of illustration, the operation of circuit 10 will be described hereafter in reference to the low distortion amplification of a two tone input signal $S_{in}$ with high frequency, sinusoidal tones at frequencies f1 and f2. It is understood, however, that low distortion amplification of multi-tone input signals having more than two tones can also be accomplished with amplifier circuit 10.

Amplifier circuit 10 includes power amplifier 20 functioning to produce high RF power at fundamental frequencies f1 and f2, which may lie in the UHF frequency band, for example. Frequencies f1 and f2 are assumed to be at fc−γ and fc+γ, respectively, where fc is a reference carrier frequency. Now, if signal $S_{in}$ were to be applied directly to the input port of power amplifier 20, the output of amplifier 20 would consist of amplified fundamental power at frequencies f1 and f2, as well as undesirable distortion frequency power at third order intermodulation distortion (IMD) frequencies f3 and f4, where f3=fc−3γ and f4=fc+3γ. With the present embodiment, these intermodulation products are substantially reduced by employing cuber circuit 14, which produces an optimum amount of power at distortion frequencies f3 and f4. This power will essentially cancel the power at f3 and f4 inherently produced by power amplifier 20 to produce a distortion free output signal $S_{out}$.

Briefly, input signal $S_{in}$ is split by means of coupler 12 to produce a direct path output signal that is applied to delay line 13, and a coupled path output applied to cuber 14. Cuber 14 produces output signal S1 containing components at frequencies f1–f4 with the amplitude of each frequency component optimized. Signal S1 also contains some undesirable power at the fifth order IM frequencies f5=fc−5γ and f6=fc+5γ and at higher order frequencies as well. A highly linear, variable low noise amplifier (LNA) 16 amplifies signal S1 to adjust the amplitude of the cuber output.

Variable phase shifter 17 is utilized to phase shift the output of LNA 16 to provide signal S2 that is applied to one input port of summer 18. The output of delay line 13 is applied to the other input port of summer 18. The primary function of delay line 13 is to match the delay, at frequencies f1 and f2, of the components in the predistortion path—that is, cuber 14, LNA 16 and interconnecting transmission lines (but not the desired phase shift of phase shifter 17). By proper selection of the delay line 13 electrical length and of the phase shifter 17 phase shift, summer output signal S3 can be provided with the phase of the fundamental and distortion frequencies independently controlled. For instance, if an unequal power splitting Wilkinson type combiner is used for summer 18, and the f1 and f2 components of signal S2 are 180° out of phase with those of the delay line 13 output signal, then the f1 and f2 components of signal S3 will be the delay line 13 output signal minus signal S2, at an arbitrary phase of Θf degrees. In this case, the f3 and f4 components of signal S2 will be at an arbitrary phase of Θd degrees. If the delay line 13 electrical length changes, the magnitude of the f1 and f2 components of signal S3 will be increased because a pure subtraction no longer occurs and the phase will differ from Θf. Meanwhile, the phase of the f3 and f4 components of signal S3 remains at Θd. Accordingly, the absolute phase of the f1 and f2 components of signal S3 may be independently controlled relative to the absolute phase of the f3 and f4 components of signal S3. This independent phase control will enable cancellation of the distortion frequencies within power amplifier 20, provided that the amplitude of the distortion components of signal S3 is properly set. Accordingly, the AM to PM conversion in the amplifier 20 can be compensated for. For instance, if amplifier 20 has a voltage gain of G1 and the f3 and f4 components of signal S3 are each of a magnitude A3, then these components will be amplified and appear as components of the $S_{out}$ signal, each with amplitudes of A3G1. Meanwhile, the f1 and f2 components of signal S3 are amplified and produce, as part of the $S_{out}$ signal, IMD products at f3 and f4, each with amplitude B3. Hence, if the $S_{out}$ distortion components with magnitude A3G1 is 180° out of phase with the $S_{out}$ distortion products with magnitude B3, then all distortion frequency output power of $S_{out}$ will be eliminated if A3G1=B3. The present embodiment is operative to provide this desirable result.

One practical limitation with this embodiment is the presence of fifth order distortion components in the $S_{out}$ signal at frequencies f5=fc−5γ and f6=fc+5γ. This fifth order distortion consists of three parts: 1) the original fifth order distortion created by power amplifier 20 due only to the amplification of the f1 and f2 components of signal S3; 2) fifth order components of signal S2 due to imperfections in cuber circuit 14; and 3) fifth order distortion produced in power amplifier 20 due to the interaction between the f1, f2 components and f3, f4 components of the S3 signal as they are amplified. Since power amplifier 20 will operate in a more linear region than cuber circuit 14, item (2) above would be the dominant part among the 5th order terms. It is therefore important for the cuber to produce minimal 5th order residue. The cubic response of cuber circuit 14—i.e., the ability to produce third order intermodulation power (at frequencies fc+3γ and fc−3γ)—is derived from the non-linear response of semiconductor diodes employed therein.

Figure 2:
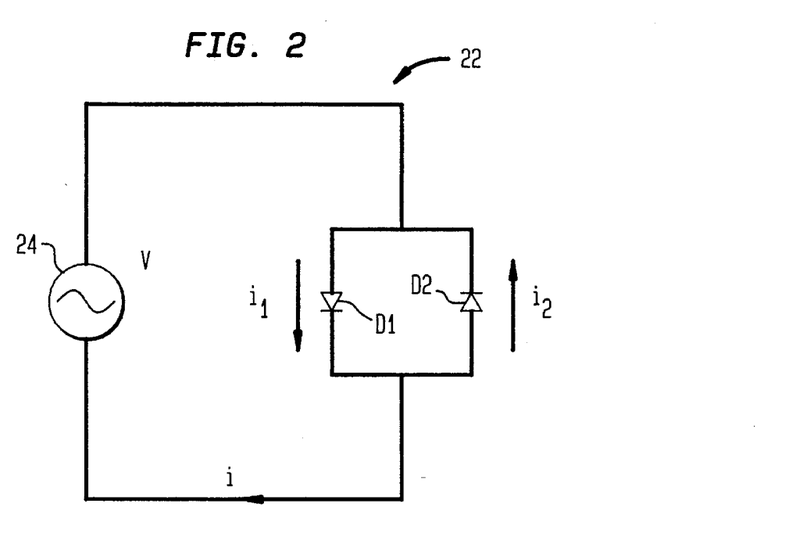
FIG. 2 is representation of an ideal anti-parallel diode configuration.

To provide a foundation for the detailed operation of the embodiments of cuber circuit 14 to be described subsequently, reference is first had to a simplified anti-parallel diode cubic predistorter 22 as shown in FIG. 2. A pair of identical anti-parallel diodes D1 and D2 are driven by a time varying input voltage "v" produced by a voltage source 24. Each diode D1,D2 has the following voltage-current relationship:

$$i_D = I_0(e^{\beta v} - 1), \quad (1)$$

where v is the voltage across the diode, β is typically 40 volts$^{-1}$, $I_0$ is the reverse saturation current of each diode, and $i_D$ is the current flowing through each diode ($i_D$=$i_1$ and $i_2$ for diodes D1 and D2, respectively). The combined current flow of the identical antiparallel diodes is, $$i = i_1 - i_2 = I_0(e^{\beta v} - e^{-\beta v}). \quad (2)$$

Thus, $$i = 2I_0\left(\beta v + \frac{(\beta v)^3}{3!} + \frac{(\beta v)^5}{5!} + \ldots \right). \quad (3)$$

If voltage is derived by passing i through a low value resistor (not shown) of less than about 1Ω, an output voltage can be obtained which consists of first, third and fifth order terms of the input voltage. The first order term can be cancelled by proper combining with the input voltage. The 5th order term can be made arbitrarily small by controlling the value of βv to be much less than unity. What remains, then, is essentially a 3rd order term.

A typical high frequency diode has an $I_0$ current of about 20 nA, which implies a high conversion loss between the input and output signals. Therefore, thermal noise would overwhelm the output power, unless the circuit is operated at a large βv value; however, the latter would cause the higher order distortions to dominate the cubic distortion. Secondly, to avoid excessive conversion loss, a larger resistor is needed for the output voltage. It is noted that a large resistor in circuit 22 would change the ideal voltage-current formula of equation (2).

Figure 3:
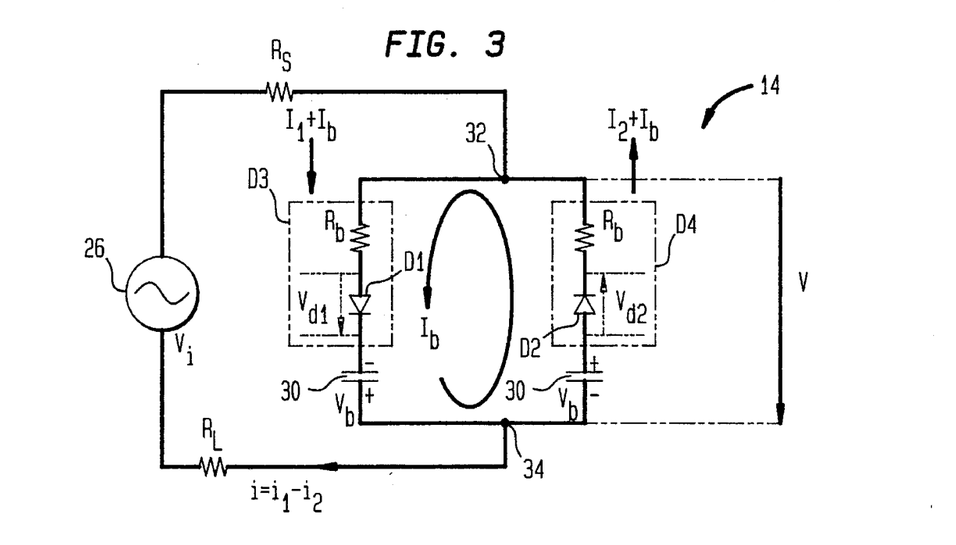
FIG. 3 shows an embodiment of a cuber circuit which can be used within a low distortion amplifier circuit of the present invention.

Referring now to FIG. 3, there is shown one embodiment of cuber circuit 14 which can be used in circuit 10 of FIG. 1. A pair of packaged diodes D3 and D4 include ideal diodes D1 and D2, respectively, with each ideal diode in series with a bulk resistance $R_b$. This bulk resistance $R_b$ is associated with every commercially available diode and is typically on the order of 10–20 ohms. A pair of DC sources 30 each supply a DC bias voltage $V_b$ in a series path with each diode D3 and D4. The introduction of bias voltage $V_b$ produces a bias current, $I_b$, which is many orders of magnitude larger than $I_0$. The current $I_b$ is added with the currents i1 and i2 that would otherwise flow through respective ideal diodes D1 and D2, so that the current i1+$I_b$ now flows through diode D3, and current i2+$I_b$ flows through diode D4.

Replacing voltage source 24 of the ideal circuit of FIG. 2 is the series combination of a voltage source 26 that produces a time varying input voltage $V_i$, a source impedance $R_s$ and a load impedance $R_L$. Load impedance $R_L$ is essentially the input impedance of amplifier 16 of FIG. 1. If an impedance transformer is utilized between cuber circuit 14 and amplifier 16, $R_L$ will be the impedance "looking into" the transformer/amplifier arrangement. Load resistance $R_L$ is introduced to derive meaningful power to combat subsequent amplifier noise.

The voltage $V_i$ represents the superimposed, multi-tone sinusoidal voltages supplied to cuber 14 from the coupled output path of coupler 12. Source impedance $R_s$ is the impedance "looking back" towards directional coupler 12 from cuber input port 15. Typically, characteristic impedance Zo of coupler 12 is 50Ω; however it is desirable to transform the 50Ω impedance to a much lower impedance on the order of one ohm. Hence, impedance $R_s$ will be the lower transformed impedance. The transformation may be realized at higher frequencies with the use of a multi-stepped microstrip transformer (not shown) between coupler 12 and cuber circuit 14 with each step being a quarter wavelength long so that the 50Ω impedance is transformed in several steps down to the much lower impedance $R_s$. Such multi-stepped transformers are well known in the art and generally utilized to transform impedances over narrow to medium range bandwidths. At lower frequencies, a lumped element transformer would be used.

This embodiment uses optimized values for the parameters $R_b$, $R_s$, $R_L$, and $V_b$, which are selected to arrive at cuber circuit 14, which can operate over an optimized dynamic range of $V_i$. The mathematical power series based analysis set forth below, enables one skilled in the art to select the above-noted parameters so that a desired cuber circuit output power at the third order frequencies is obtained while output power at fifth and higher order frequencies is minimized. The lower end of the dynamic range will be shown to be limited by the noise within the circuit; the higher end is limited by the eventual dominance of the fifth and higher order power over the third order power.

I. Circuit Analysis Using Power Series Expansion

At the outset, the input voltage $V_i$ will produce a voltage "V" across the nodes 32 and 34 according to the equation:

$$V = V_i - iR, \tag{4}$$

where $R = R_s + R_L$. Also, $$I_b = I_0(e^{\beta(V_b - I_b R_b)} - 1). \tag{5}$$

A voltage $V_{d1}$ will appear across the diode D1 as:

$$V_{d1} = V - i_1 R_b + V_b - I_b R_b. \tag{6}$$

Therefore, $$i_1 + I_b = I_0(e^{\beta V_{d1}} - 1) = (I_b + I_0)e^{\beta(V - i_1 R_b)} - I_0, \tag{7}$$

or, $$i_1 = I_s e^{\beta(V - i_1 R_b)} - I_s, \tag{8}$$

where $I_s \equiv I_b + I_0$. Similarly, we obtain, $$i_2 = I_s e^{-\beta(V + i_2 R_b)} - I_s, \tag{9}$$

and, $$i = i_1 - i_2 = I_s[e^{\beta(V - i_1 R_b)} - e^{-\beta(V + i_2 R_b)}]. \tag{10}$$

From the symmetry of the circuit, it can be shown that $$i(V) = -i(-V) \text{ and } i(V_i) = -i(-V_i). \tag{11}$$

Since i is an odd function of $V_i$, it should be expressible as an odd series of $V_i$, to wit, $$i = C_1 V_i + \left(\frac{C_3}{3!}\right) V_i^3 + \left(\frac{C_5}{5!}\right) V_i^5 + \ldots \tag{12}$$

Equation (8) can first be solved for V as a power series expansion in $i_1/I_s$:

$$\beta V = \ln\left[1 + \left(\frac{i_1}{I_s}\right)\right] + I_s \beta R_b \left(\frac{i_1}{I_s}\right) = \xi\left(\frac{i_1}{I_s}\right) - \tag{13}$$

$$\frac{1}{2}\left(\frac{i_1}{I_s}\right)^2 + \frac{1}{3}\left(\frac{i_1}{I_s}\right)^3 - \frac{1}{4}\left(\frac{i_1}{I_s}\right)^4 + \ldots$$

where ξ is defined as:

$$\xi \equiv 1 + I_s \beta R_b. \tag{14}$$

Using the power series reversion formula—as disclosed by M. Abramowitz and I. A. Stegun, Eds., "Handbook of Mathematical Functions", National Bureau of Standards, Applied Mathematics Series #55, 3rd Printing, March 1965, page 16, Eq. (3.6.25)—gives $i_1/I_s$ as a power series in βV:

$$\frac{i_1}{I_s} = \left(\frac{1}{\xi}\right)(\beta V) + \left(\frac{1}{2\xi^3}\right)(\beta V)^2 - \left(\frac{3 - 2\xi}{6\xi^5}\right)(\beta V)^3 + \tag{15}$$

$$\left(\frac{15 - 20\xi + 6\xi^2}{24\xi^7}\right)(\beta V)^4 + \ldots$$

Similarly the power series for $i_2/I_s$ is found as:

$$\frac{i_2}{I_s} = -\left(\frac{1}{\xi}\right)(\beta V) + \left(\frac{1}{2\xi^3}\right)(\beta V)^2 - \left(\frac{3 - 2\xi}{6\xi^5}\right)(\beta V)^3 + \tag{16}$$

$$\left(\frac{15 - 20\xi + 6\xi^2}{24\xi^7}\right)(\beta V)^4 + \ldots$$

Combining Equations (15) and (16) gives, $$\frac{i}{2I_s} = \frac{i_1 - i_2}{2I_s} = \left(\frac{1}{\xi}\right)(\beta V) + \left(\frac{3 - 2\xi}{3!\xi^5}\right)(\beta V)^3 + \left(\frac{105 - 210\xi + 130\xi^2 - 24\xi^3}{5!\xi^9}\right)(\beta V)^5 + \ldots \quad (17)$$

Again applying series reversion, V expanded in powers of i is, $$\beta V = \xi\left(\frac{i}{2I_s}\right) - \frac{3 - 2\xi}{6\xi}\left(\frac{i}{2I_s}\right)^3 + \left(\frac{8\xi^3 - 30\xi^2 + 30\xi - 5}{40\xi^3}\right)\left(\frac{i}{2I_s}\right)^5 + \ldots \quad (18)$$

Combining Equations (4) and (18) gives a power series for $V_i$ in terms of i, $$\beta V_i = \eta\left(\frac{i}{2I_s}\right) - \frac{3 - 2\xi}{3!\xi}\left(\frac{i}{2I_s}\right)^3 + \left(\frac{24\xi^3 - 90\xi^2 + 90\xi - 15}{5!\xi^3}\right)\left(\frac{i}{2I_s}\right)^5 + \left(\frac{720\xi^5 - 4620\xi^4 + 10080\xi^3 - 8820\xi^2 + 2730\xi - 315}{7!\xi^5}\right)\left(\frac{i}{2I_s}\right)^7 + \ldots \quad (19)$$

where η is defined as:

$$\eta \equiv 1 + I_s\beta(R_b + 2R). \quad (20)$$

Using series reversion again, one can obtain the desired power series of i in terms of $V_i$, Equation (12), where the coefficients are given by:

$$C_1 = \frac{3I_s\beta}{\eta}, \quad (21)$$

$$C_3 = \frac{2I_s\beta^3 (3 - 2\xi)}{\eta^4 \xi}, \quad (22)$$

$$C_5 = \frac{2I_s\beta^5 (40\xi^3 + 90\xi - 120\xi^2 - 24\eta\xi^3 + 90\eta\xi^2 - 90\eta\xi + 15\eta)}{\eta^7 \xi^3}, \quad (23)$$

$$C_7 = \frac{2I_s\beta^7}{\eta^{10}\xi^5} \begin{pmatrix} 7560\xi^2 - 2240\xi^5 - 15120\xi^3 + 10080\xi^4 + \\ 2688\eta\xi^5 + 2520\eta\xi - 16800\eta\xi^2 + 25200\eta\xi^3 - \\ 14112\eta\xi^4 - 720\eta^2\xi^5 + 4620\eta^2\xi^4 - \\ 10080\eta^2\xi^3 + 8820\eta^2\xi^2 - 2730\eta^2\xi + 315\eta^2 \end{pmatrix} \quad (24)$$

It is noted that, for a given bias voltage $V_b$, the output voltage across $R_L$ is completely defined by $iR_L$, where i is given by $$i = C_1 V_i + \left(\frac{C_3}{3!}\right) V_i^3 + \left(\frac{C_5}{5!}\right) V_i^5 + \left(\frac{C_7}{7!}\right) V_i^7 + \ldots, \quad (12)$$

and the C's are defined by Equations (21)–(24). It is also noted that $C_5$, i.e., the 5th order distortion, can be reduced by adjusting R, for any fixed bias current.

II. Two Tone Case

A convenient method of measuring the performance of cuber circuit 14 is to use a time varying input voltage $V_i$ consisting of two sine waves of different frequencies fc+γ and fc−γ as mentioned previously. It is understood, however, that cuber circuit 14 can also be used to generate third order output when $V_i$ is made up of more than two sinusoidal tones. (Moreover, it is noted that cuber circuit 14 can also be used to generate third harmonic power for a single tone input, to cancel or tailor third harmonic power generated in the main power amplifier. This would be desirable in some microwave amplifiers to increase efficiency by shaping voltage and current waveforms using harmonic power.)

For the two-tone input, $V_i$ is defined as:

$$V_i = a\cos(\omega_c t + \delta t) + a\cos(\omega_c t - \delta t) = 2a\cos(\delta t)\cos(\omega_c t), \quad (25)$$

where $\omega_c = 2\pi fc$ and $\delta = 290 \gamma$. Inserting Equation (25) into Equation (12) and retaining only terms in the band centered on the radian carrier frequency, $\omega_c$, a current $i_f$ flowing through $R_L$ in the fundamental frequency band, can be found as:

$$i_f = C_1 a[\cos(\omega_c t + \delta t) + \cos(\omega_c t - \delta t)] + \quad (26)$$

$$\left[\left(\frac{C_3}{3!}\right)\frac{9}{4} a^3 + \left(\frac{C_5}{5!}\right)\frac{25}{4} a^5 + \right.$$

-continued $$\left.\left(\frac{C_7}{7!}\right)\frac{1225}{64} a^7\right] [\cos(\omega_c t + \delta t) + \cos(\omega_c t - \delta t)] +$$

$$\left[\left(\frac{C_3}{3!}\right)\frac{3}{4} a^3 + \left(\frac{C_5}{5!}\right)\frac{25}{8} a^5 + \right.$$

$$\left.\left(\frac{C_7}{7!}\right)\frac{735}{64} a^7\right] [\cos(\omega_c t + 3\delta t) + \cos(\omega_c t - 3\delta t)] +$$

$$\left[\left(\frac{C_5}{5!}\right)\frac{5}{8} a^5 + \left(\frac{C_7}{7!}\right)\frac{245}{64} a^7\right] [\cos(\omega_c t + 5\delta t) +$$

$$\cos(\omega_c t - 5\delta t)] + \left(\frac{C_7}{7!}\right)\frac{35}{64} a^7 [\cos(\omega_c t + 7\delta t) + \cos(\omega_c t - 7\delta t)].$$

Accordingly, by proper selection of the parameters $C_1$, $C_3$, $C_5$ and $C_7$, which are in turn functions of the circuit parameters of FIG. 3 described hereinabove, a desired third order output power can be realized while power at the other frequencies is controlled.

III. Dynamic Range Considerations

Since the purpose of cuber circuit 14 is to provide a third order output that can be used to cancel the third order power generated in power amplifier 20, the fifth and higher order distortion from cuber 14 are undesirable, unless they can be controlled to cancel similar terms in the power amplifier. Thus, for example, if it is desired to cancel the third order distortion by 30 dB, the high power limit of the cuber predistorter arrangement occurs when the input power to cuber 14 is high enough to make the fifth and higher order distortion equal to 0.1% (i.e., −30 dB) of the third order output of the cuber. Allowing the input power to rise above this point would begin to defeat the purpose of the cuber circuit arrangement of canceling third order distortion output, since higher order distortion output would begin to rise to unacceptably higher levels. A simple way to ensure dominance of the third order relative to the higher order distortion, is to attenuate the input signal to cuber 14 and amplify its output using variable amplifier 16 before coupling to the input of power amplifier 20. The difficulty with this approach is that the third order cuber output becomes comparable to its noise output. Thus the dynamic range of cuber 14 is determined by the range of input power between the lowest input power level—that is, the level where its third order output power is comparable to its noise output— and the highest input power level, which is where the higher order distortion becomes comparable to the third order output. These dynamic range limits are based on the assumption that the fundamental (linear) leak-through power of cuber 14 at frequencies fc+γ and fc−γ, is prevented from becoming so large that it significantly reduces the signal input to power amplifier 20 when the cuber output is coupled to the power amplifier input, thereby reducing the gain of the power amplifier to the extent that it must be redesigned. (This fundamental power is part of signal S2 of FIG. 1 which is generally subtracted from the output signal of delay line 13 by summer 18).

An important parameter in estimating the cuber noise output is its bandwidth. For example, in wireless communication applications, it is desirable to cancel the intermodulation in a radio channel to be 60 dB below the carrier level that is normally used for radio transmission in that channel (−60 dBc). At the low power limit of operation, the intermodulation of the power amplifier should just be rising above the −60 dBc level, so it would be desirable for the noise in the channel bandwidth to be about 10 dB less (−70 dBc). To compare this with the third order output of cuber 14, it is necessary to specify the number of channels, M, transmitted. The third order output per channel is approximately 1/Mth of the total intermodulation output. Thus, the low power end of the dynamic range of cuber 14 is the point where the noise power output per channel bandwidth is about 10 $\log_{10}$ (10M) dB below the third order output. Since the upper limit of the dynamic range is roughly independent of the number of channels, it is seen that the dynamic range is reduced as the number of channels increases.

Figure 4:
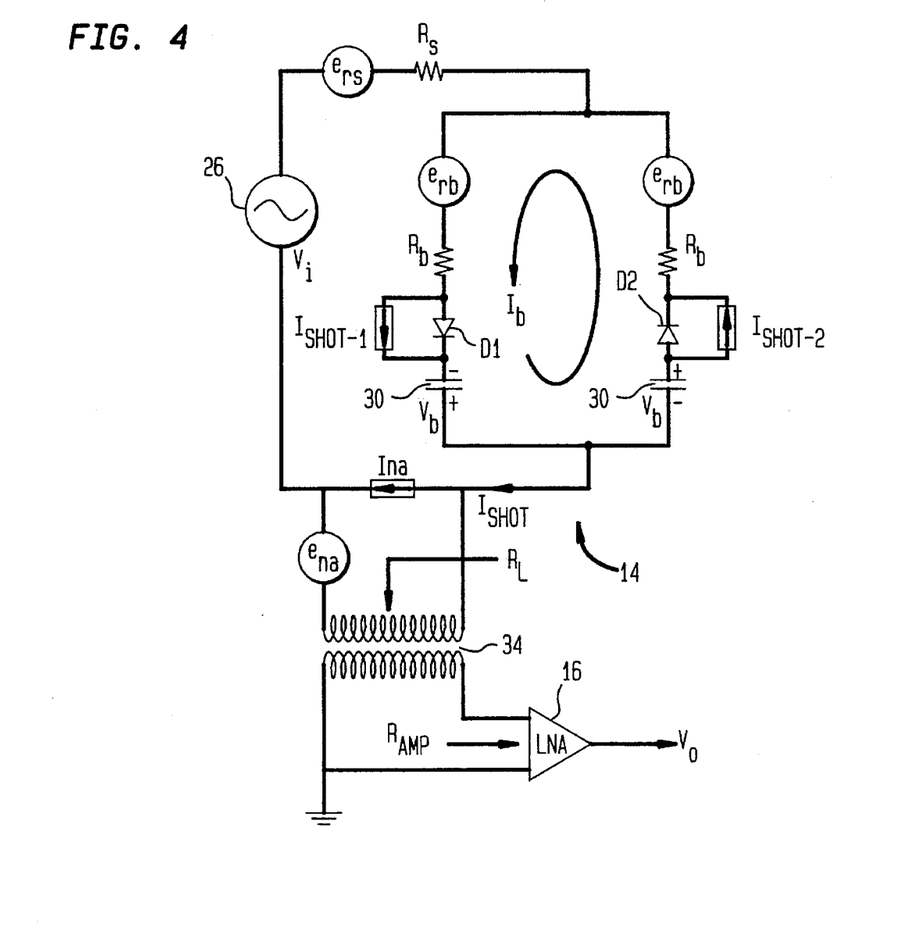
FIG. 4 illustrates noise sources within the cuber circuit of FIG. 3.

As shown in FIG. 4, the noise sources of cuber 14 consist of shot noise $I_{shot-1}$, $I_{shot-2}$ in the respective diodes D1, D2; the resistor thermal noises $e_{Rb}$, $e_{RS}$; and the noise introduced by low noise amplifier 16. To facilitate the following approximate noise analysis, it is noted that in order to maintain non-linear operation, the effective resistance of the diode junctions are biased, by means of D.C. sources 30, to be much larger than resistances $R_s$, $R_b$ and $R_L$. The load resistance $R_L$ in FIG. 4 is shown to consist of the impedance looking into a transformer 34 in front of the LNA 16.

The mean square shot noise current of a diode is given by:

$$i^2_{shot} = 2qIB, \quad (27)$$

where q is the electronic charge, 1.602($10^{-19}$) coulombs, I is the current through the diode, and B is the bandwidth of the input signal, typically 30 KHz per channel in wireless applications. Noise is of interest because it limits the low power range of operation of cuber 14, where the signal currents, $i_1$ and $i_2$ are small. Therefore, the contribution of $i_1$ and $i_2$ to the current I can be neglected and I can be approximated by the D.C. bias current $I_b$ in each of the diodes. Since diode junction resistance is much larger than $R_s$ and $R_L$, approximately all shot noise currents pass through $R_L$ via the input source. Therefore, the mean square shot noise current passing through $R_L$ is $$i^2_{shot} \cong 4qI_bB, \quad (28)$$

Similarly, the total mean square noise current passing through $R_L$ due to the two bulk resistors $R_b$ is:

$$i^2_{nb} \cong 8kTBR_b(\beta I_s)^2, \quad (29)$$

where only the linear term in Equation (15) is used and $\beta I_s R_b$ is neglected relative to unity (which implies the small signal conductance of the diode junction is $\beta I_s$ mhos). In Equation (29) the term 8kTBR$_b$ results from the mean square thermal noise voltage of resistor $R_b$, where Boltzmann's constant k=1.38×$10^{-23}$/Joules/K and, at room temperature, T=293.15K. Approximating η unity in Equation (21), the mean square noise current through $R_L$ due to the source resistance, $R_s$ is $$i^2_{ns} \cong (2\beta I_s)^2 4kTBR_s. \quad (30)$$

As shown in FIG. 4, the noise of amplifier 16 is represented by equivalent input noise voltage $e_{na}$ and current $I_{na}$ generators which can typically be assumed to be uncorrelated. The ratio of their magnitude is called the noise resistance, $R_n \equiv {}^{e_{na}}/_{i_{na}}$. The noise resistance $R_n$ of amplifier 16 can be measured by comparing its output noise when the amplifier input is open circuited, "$N_{oc}$" to that when the amplifier input is short circuited, "$N_{sc}$", as follows:

$$R_n = R_L \sqrt{\frac{N_{sc}}{N_{oc}}} \quad (31)$$

Then, in terms of amplifier 16 noise figure, F, $e^2_{na}$ is defined as $$e^2_{na} = i^2_{na}R_n^2 = \frac{4kTB(F-1)R_L}{1+\left(\dfrac{R_L}{R_n}\right)^2}. \quad (32)$$

Typically, $N_{oc} \gg N_{sc}$, so that the amplifier equivalent input noise current $I_{na}$ dominates over its equivalent input noise voltage $e_{na}$ and $R_n$ is small compared to unity. The mean square noise current through $R_L$ due to $e_{na}$ is, using the same approximation for $C_1$ as in Equation (28), $$i^2_{ena} = (2\beta I_s)^2 \frac{4kTB(F-1)R_L}{1+\left(\dfrac{R_L}{R_n}\right)^2}. \quad (33)$$

As in Equation (26), it is assumed that the small signal junction resistance of the diodes is large compared to $R_L$, so that most of $i_{na}$ flows through $R_L$:

$$i^2_{ina} \cong \frac{4kTB(F-1)R_L}{R_n^2 + R_L^2}. \quad (34)$$

The total mean square noise current $i^2_{nt}$ through $R_L$ is thus the sum of that given in Equations (28)–(30), and (32)–(34), $$i^2_{nt} = 4B \left\{ qI_b + kT \left[ (F-1)R_L \left( \frac{1+(2\beta I_s R_n)^2}{R_n^2 + R_L^2} \right) + \right. \right. \quad (35)$$

$$\left. \left. (\beta I_s)^2(2R_b + 4R_s) \right] \right\}.$$

It will be shown in later examples that the equivalent input noise current of LNA 16 is the dominant noise source so that the total mean square noise current may usually be approximated by $$i^2_{nt} \cong 4kTB(F-1)R_L. \quad (36)$$

Since LNA 16 is usually needed to set the level of the third order predistortion to be coupled into the input of power amplifier 20, it cannot be deleted in most practical applications to avoid the major noise source.

To arrive at a minimum usable input voltage $V_{imin}$, it is assumed that the cuber output signal flowing through $R_L$ is the third order current $i_{s3}$ in Eqn. (12), that is:

$$i_{s3} = \left(\frac{C_3}{6}\right)V_i^3 = \left(\frac{C_3}{6}\right)A(t)^3\cos^3(\omega_c t + \Theta(t)) = \quad (37)$$

$$\left(\frac{C_3}{24}\right)A(t)^3(3\cos(\omega_c t + \Theta(t)) + \cos 3(\omega_c t + \Theta(t))),$$

where $A(t)$ and $\Theta(t)$ are the slowly varying (with respect to the radian carrier frequency, $\omega_c$) envelope and phase, respectively, of the narrowband representation of the input signal. Thus, the fundamental-band, mean square, third order current through $R_L$ is:

$$\overline{i_{s3}^2} = \frac{1}{2}\left(\frac{C_3}{8}\right)^2 <A^6> \cong \frac{I_s^2}{10} <(\beta V_i)^6>, \quad (38)$$

where the brackets, <>, imply the average value of the argument, and the second approximation in Equation (37) assumes $\xi=\eta=1$, as in Equation (36).

It can then be determined that the minimum usable input voltage $V_{imin}$ is applied when $$\overline{i_{s3}^2} \equiv XM\overline{i_n^2}, \quad (39)$$

where X is the power amplifier intermodulation level, relative to the channel bandwidth noise level—e.g., 10 dB in the above example.

Accordingly, using the above noise analysis, one can arrive at the lower end of the dynamic range of cuber circuit 14, as a function of variables such as targeted intermodulation output level (−60 dBc in the above example), channel bandwidth B, LNA 16 noise figure F, and load resistance $R_L$.

IV. Determining Maximum Input Level

Having thus formulated a criteria for arriving at the minimum input voltage $V_{imin}$ to cuber circuit 14, guidelines for determining a maximum input voltage, $V_{imax}$ will now be presented. A determination of $V_{imax}$ will then establish the dynamic range of cuber circuit 14.

Referring again to Equation (39), $V_{imin}$ is defined as the input voltage which yields a 3rd order output mean square current which is X times stronger than the mean square noise current (primarily the output amplifier 16 noise) on a per-channel basis. With X=10 as an illustrative case, Eqns. (35), (38) and (39) give, $$V_{imin} = \left\{\frac{1600MB}{C_3^2}\left[q(I_s - I_0) + kT(F-1)R_L\frac{1 + (2\beta I_s R_n)^2}{R_n^2 + R_L^2} + \right.\right.$$

$$\left.\left. kT(\beta I_s)^2(2R_b + 4R_s)\right]\right\}^{1/6} \quad (42)$$

The maximum cuber circuit input voltage, $V_{imax}$, is defined hereafter as the input voltage which produces 5th or 7th order output voltages that are within "Y" dB of the 3rd order output, where Y represent the amount of 3rd order power cancellation which is desired in power amplifier 20. An exemplary value for Y is 30 dB (or 1,000). With $V_i = V_{imax}$, Eqn. (12) yields:

$$\left(\frac{C_7}{7!}\right)^2 V_{imax}^{14} + \left(\frac{C_5}{5!}\right)^2 V_{imax}^{10} \equiv \frac{1}{Y}\left(\frac{C_3}{3!}\right)^2 V_{imax}^6. \quad (43)$$

The decibel difference between $V_{imax}$ and $V_{imin}$ is defined as the dynamic range: $20\log_{10}(V_{imax}/V_{imin})$. The exemplary −30 dB limit (i.e., Y=1,000) on the higher than 3rd order distortions is an arbitrary choice based on the assumption that the predistorter arrangement will be used to cancel the 3rd order intermodulation of power amplifier 20 by about 30 dB, at which point the 5th or 7th order distortion can become major contributors to overall distortion if they exceed −30 dB relative to the 3rd order predistorter output. Other choices for "Y" can be made if so desired; however, they would have only a small effect on the dynamic range (because of the rapid increase of the 5th and 7th order distortion at the high input power), and furthermore parameter optimization is only slightly affected by the particular choice of dynamic range.

The following qualitative comparisons for a) $V_{imax}$ range; b) circuit resistances; and c) bias current, were obtained assuming diodes with the characteristics: $I_0$=2 nA, $R_b$=13 Ohms, and $\beta$=38.686/volt. For noise calculations, it is assumed that MB=1 MHz (e.g., 40 channels with 25 kHz bandwidth); LNA 16 noise figure of 6 dB (F=4.0); and a zero equivalent noise resistance ($R_n$=0).

To determine an exemplary range of $V_{imax}$, it is first noted that most of the input voltage appears across diodes D1 and D2. Since the fundamental nonlinearity is $\exp(\beta V_i)$, the higher order harmonics become significant after $\beta V_i$ is greater than unity. Experimental results have indicated that, in order to keep the 5th and 7th order terms 30 dB below the 3rd order term, $\beta V_{imax}$ is in the range of 2 to 3, or $V_{imax}$ is about 50 to 75 mV—a result which is fairly independent of the bias current or the total resistance in the circuit.

As for the resistance in the circuit—the load resistance $R_L$ has an impact on the output power and also on the relative strength of the power series coefficients, $\{C_i\}$. In order to emphasize the similarity of the dependence of dynamic range on circuit resistance for various bias currents, a diode resistance $R_D$ is conveniently defined by $$R_D \equiv \left(\frac{1}{C_1}\right) - R = \frac{1 + I_s\beta R_b}{2I_s\beta}. \quad (44)$$

Figure 5:
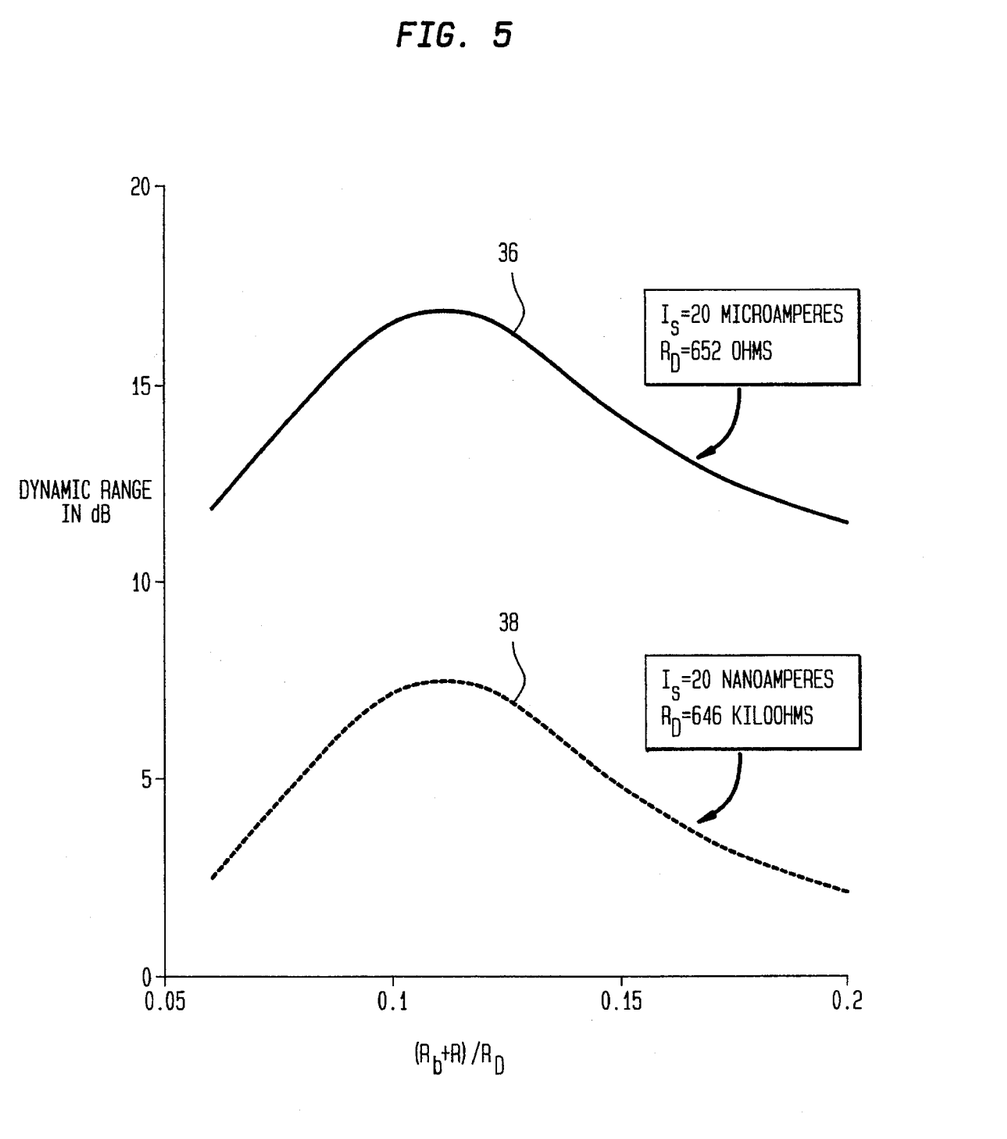
FIG. 5 depicts graphs of dynamic range as a function of resistances within the circuit of FIG. 3.

The graphs of FIG. 5 show the effect of $R_L$ on the dynamic range for an $I_s$ of 20 nA (with $R_D$=646KΩ—graph 38), and of $I_s$=20 μA (with $R_D$=652Ω—graph 36). Plotting dynamic range versus $(R_L+R_s+R_b)/R_D$ shows the similarity in the dynamic range dependence on resistance for various bias currents. The optimum total resistance $R_L+R_s+R_b$, which produces maximum dynamic range, is about 11% of $R_D$, roughly independent of the bias current. Indeed, if one neglects higher powers of $\beta I_s R$, the resistance which nulls the fifth order output satisfies $$R_L + R_s + R_b = \frac{R_D}{9} = \frac{2}{9}R_b, \quad (45)$$

which approximates the 11% result. With the fifth order output nulled, $V_{imax}$ is seen to be dependent primarily on $\beta$, under the approximation:

$$V_{imax} \cong \left(1 - \frac{R_b}{90R + 91R_b}\right)\frac{1.725}{\beta}. \quad (46)$$

Figure 6:
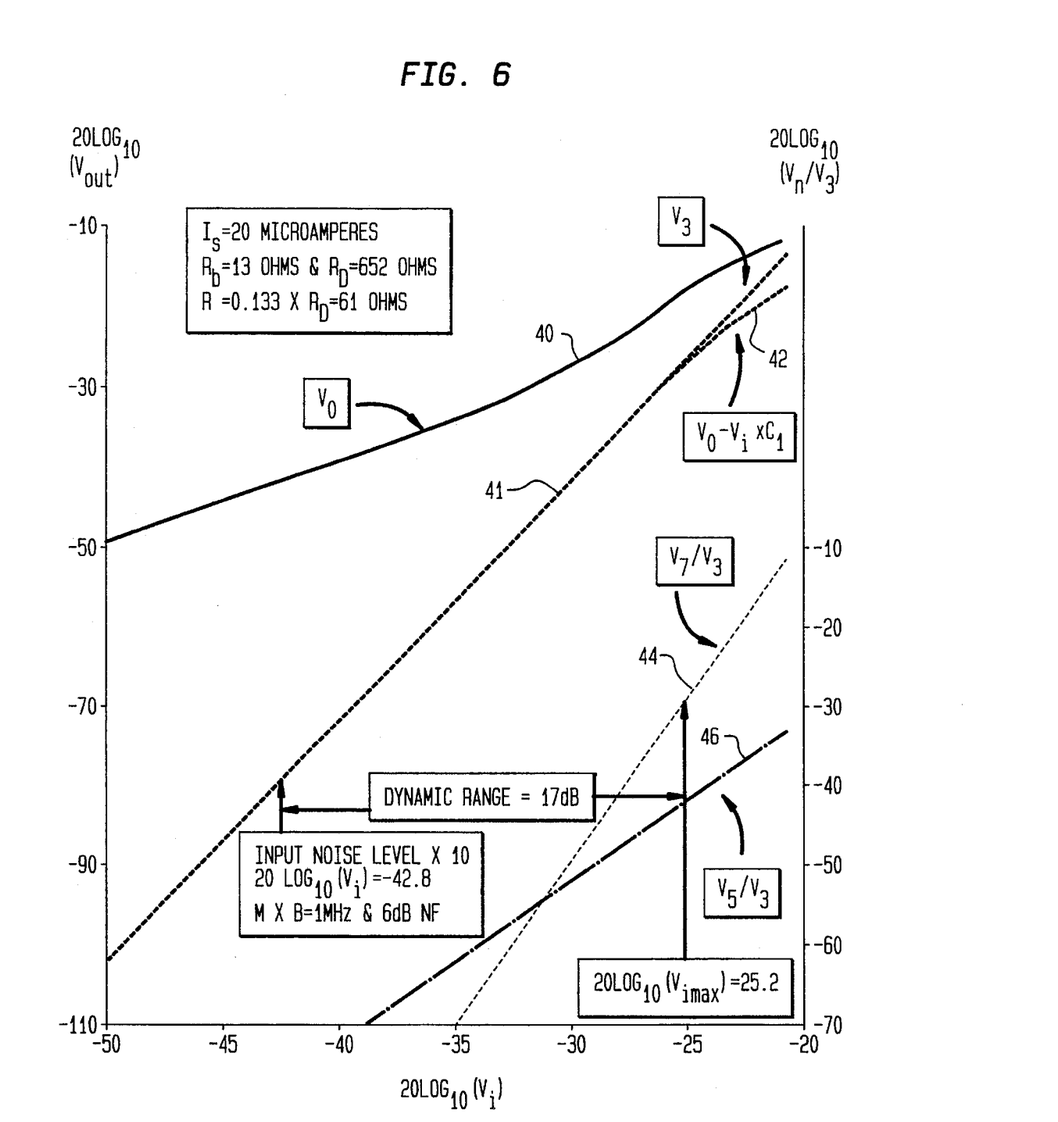
FIG. 6 shows graphs of the magnitude of various frequency components of the cuber circuit output as a function of input voltage.

Referring now to FIG. 6, the LNA 16 output voltage $V_{out}$ (which is an amplified replica of the cuber circuit 14 output) of the various orders of nonlinearity are shown as a function of the cuber circuit input voltage, $V_i$. Graphs 40, 41 and 42 (to be read with the left hand vertical axis) are plots of the fundamental components $V_0$ and third order components $V_3$, respectively, of $V_{out}$, versus $V_i$; graph 42 shows the relationship $(V_0-V_iC_1)$ versus $V_i$. Graphs 44 and 46 (to be read with the right hand vertical axis) show the respective 7th order and 5th order cuber circuit output voltages with respect to the 3rd order output—$V_7/V_3$, and $V_5/V_3$, respectively. It is noted that in the shown example, with $I_s$=20 μA, $R_b$=13Ω, $R_D$=652Ω, R=0.113 $R_D$= 61Ω—that at 20

$Log_{10}(V_i)=-42.8$ dB, the third order voltage $V_3$ equals 10 times the noise voltage output of the cuber circuit. Moreover, at $20 Log_{10}(V_i)=-25.2$ dB, the 7th order distortion is about 30 dB less than the 3rd order distortion. This results in approximately a 17 dB dynamic range for cuber circuit 14, using a 30 dB cancellation criteria.

Attention is now turned to the effects of bias current on dynamic range. Eqn. (10) indicates that the output current "i" has a linear dependence on $I_s=(I_b+I_0)$; therefore biasing increases the output signal-to-noise ratio. For example, the near optimum bias of 20 µA is about 10,000 times larger than the 2 nA $I_0$ and provides about 40 dB more noise margin to the cuber output compared to the non-biased case.

Figure 7:
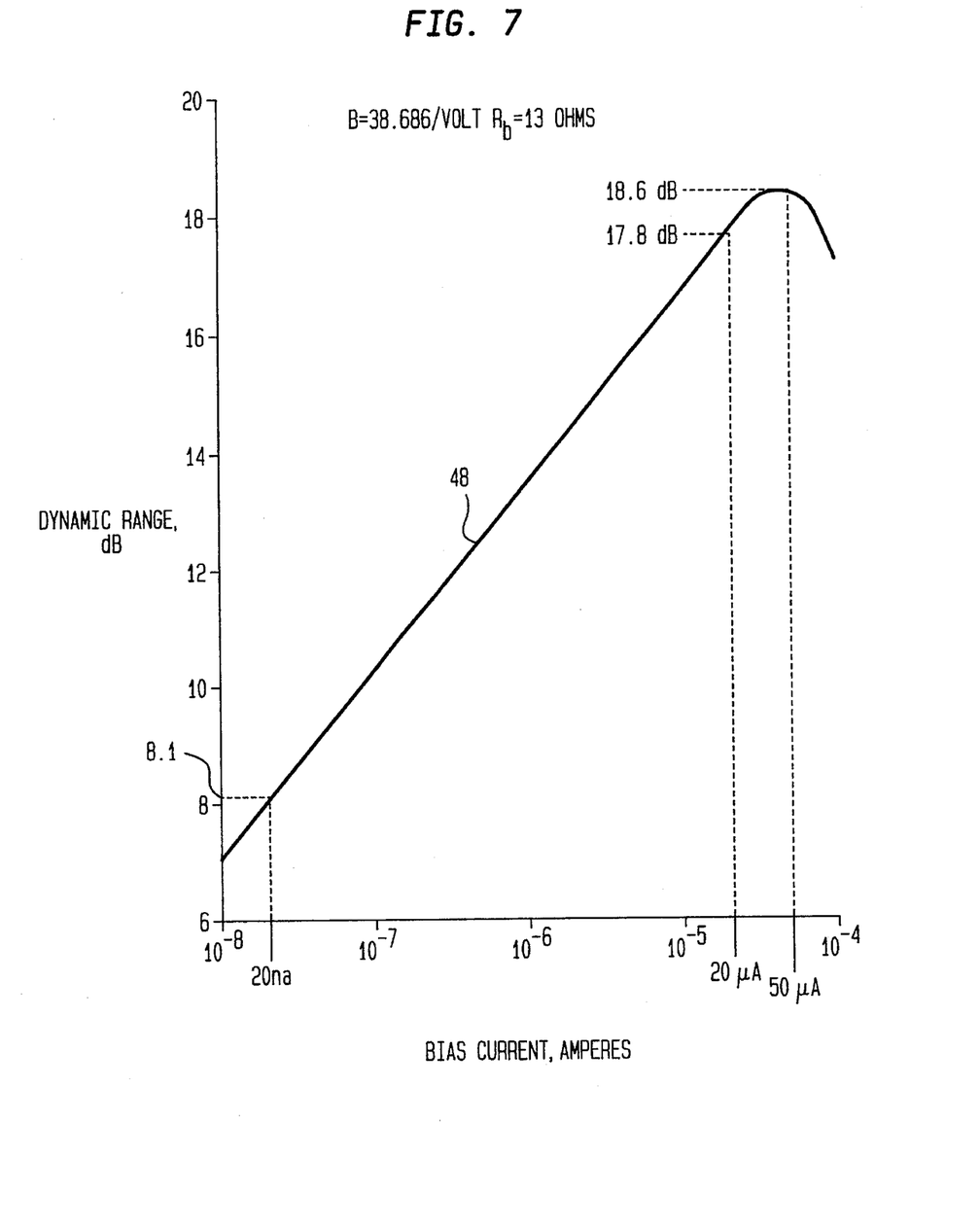
FIG. 7 is a graph of the cuber circuit dynamic range as a function of bias current.

Referring to FIG. 7, there is shown a graph 48 representing optimized dynamic range as a function of bias current $I_s$. Increasing the bias current from $I_s=20$ nA to 10 µA results in an increase in the dynamic range at the rate of 0.333 dB per dB increase of bias current. The dynamic range peaks at a value of 17.9 dB for a bias current of 50 µA. Above 50 µA the dynamic range decreases because the bulk resistance of the diode, at a value of $R_b=13$ ohms becomes comparable to $R_D$. Further reduction of $R_D$ through biasing changes the exponential nature of the diode I-V curve toward linear and therefore reduces the non-linearity of the diode pair. Less non-linearity implies a smaller $C_3$ component and thus a smaller output noise margin.

Figure 8:
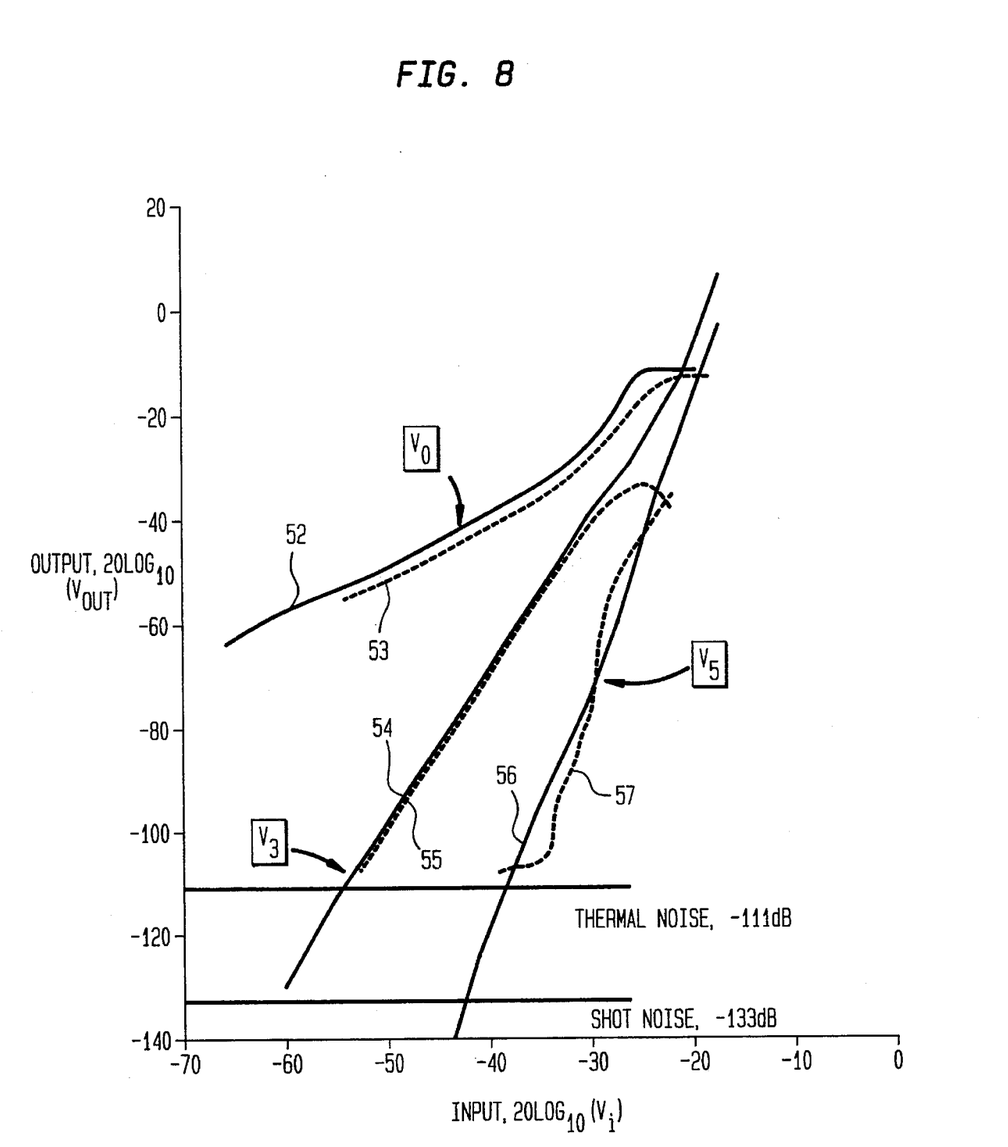
FIG. 8 shows graphs which compare predicted and measured results for a cuber circuit of the present invention.

With reference now to FIG. 8, there is shown measured (dotted lines) versus predicted (solid lines) results for cuber circuit 14 of FIG. 3. The results are for the two-tone input signal case, and with LNA 16 input impedance as the load impedance $R_L$. The dimes used for D3 and D4 were Hewlett Packard Schottky barrier diodes, part #2288. These diodes were measured to have a bulk resistance $R_b$ of 13 ohms, a reverse saturation current of 2 nA and an ideality factor of n=1 (i.e., β=38.686/volt at room temperature). The diode junction capacitance is 0.6 pF, and transit time is 6 nanoseconds. At 1 MHz, where the two tones used for FIG. 8 were centered with a 100 kHz separation, the effects of the transit time and junction capacitance are negligible. However, they have a strong effect at UHF, as will be seen below. A 20 µA bias current $I_b$ was used in the power series calculations and measurements, with $R_s=1$ ohm and $R_L=25$ ohms. An $R_L$ of 25 ohms provided acceptable performance, while facilitating 5th order distortion measurements. (It is noted that an $R_L$ of 58 ohms would have nulled the 5th order intermodulation).

In FIG. 8, curve 52 represents the predicted fundamental component voltage $V_0$, per tone, of the LNA output voltage $V_{out}$, as a function of the input voltage $V_i$ to tuber circuit 14 with the circuit parameters as described above, and using the power series approximation described previously. Curve 53 represents the corresponding measured results for $V_0$. Likewise, curves 54 and 55 are the predicted and measured results, respectively, for the third order component $V_3$, per tone, of LNA 16 output voltage; curves 56 and 57 are the respective predicted and measured fifth order voltage $V_5$. From the figure it is seen that the power series approximation is accurate until βV exceeds unity. Also shown in FIG. 8 are the rms shot noise (−133 dB) and thermal noise (−111 dB) output voltages in a 30 kHz bandwidth. It is seen that the thermal noise, predominantly due to the amplifier noise, dominates.

Figure 9:
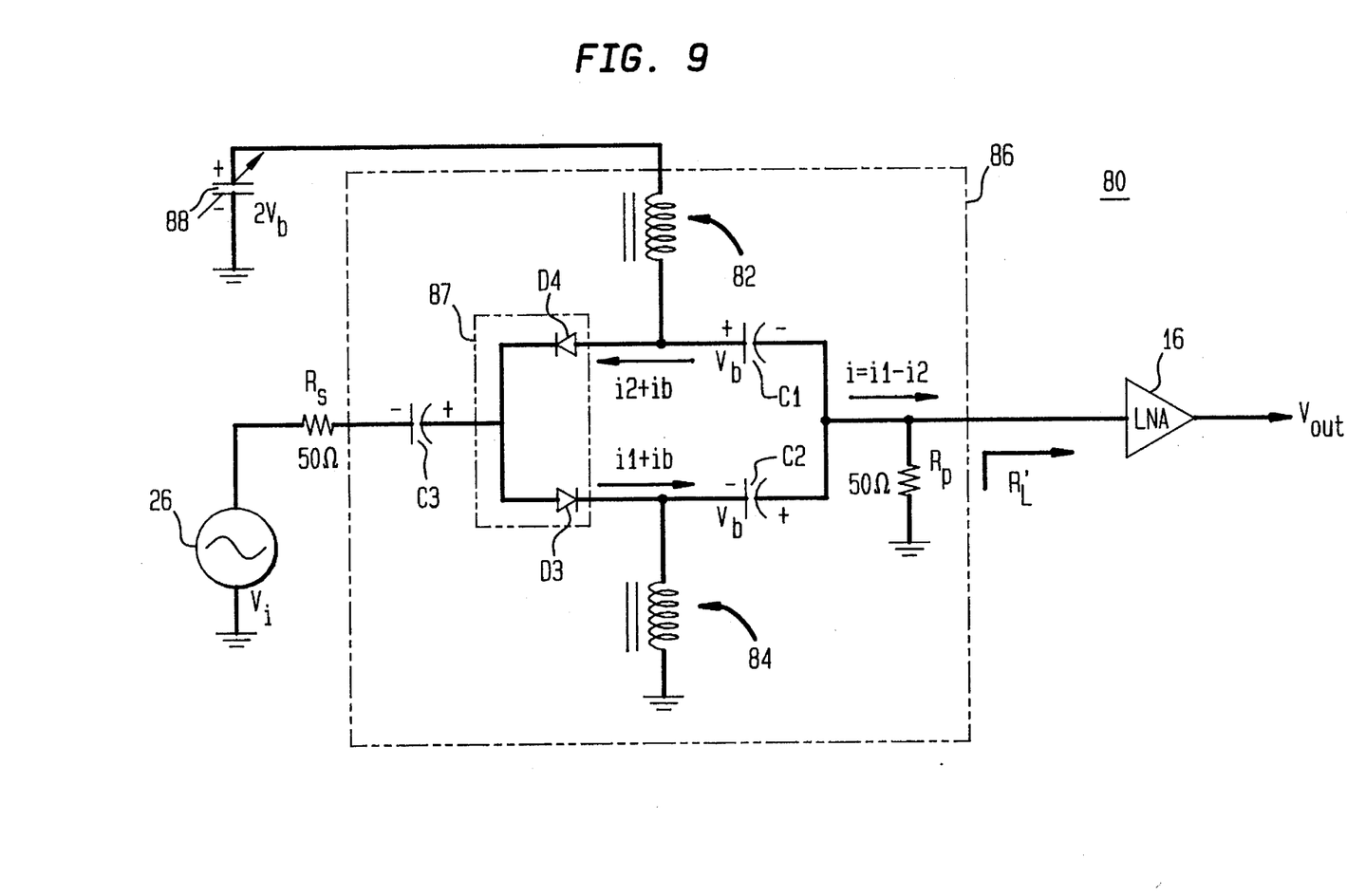
FIG. 9 is an embodiment of a UHF cuber circuit according to the present invention.

FIG. 9 shows a cuber circuit 80 suitable for use at UHF frequencies which can be used for cuber circuit 14 of FIG. 1. The equations (4)–(46) governing the performance of cuber circuit 14, are equally applicable to cuber circuit 80, with the following subtleties. First, the aforementioned load impedance $R_L$ is comprised of a shunt resistance $R_p$ in parallel with input impedance $R_L'$ of LNA 16. Secondly, voltage sources 30 of FIG. 4, which produce the bias voltages $V_b$, are realized by capacitors C1 and C2, each of which stores a bias voltage $V_b$. The driving force behind this biasing is a variable voltage source 88 that produces a bias voltage of 2 $V_b$. AC chokes 82 and 84, preferably inductors with ferrite beads to prevent the bias circuit from loading down the RF signals, are employed to introduce the DC bias to the anti-parallel diode configuration, thereby allowing bias current $I_b$ to flow. Capacitor C3 acts as a D.C. block. This biasing arrangement is more practical than one which utilizes a separate D.C. source in series with diodes D3 and D4, as was depicted in FIG. 3—yet the same biasing function is realized with the single source approach.

The components within the dotted line 86 comprise the printed circuit portion of the cuber circuit. The antiparallel diodes inside dotted line 87 are available as a commercial package from Hewlett Packard, HP part #2812. This part is typically utilized in mixer applications where D.C. bias is not used to bias the diodes D3 and D4.

Figure 10:
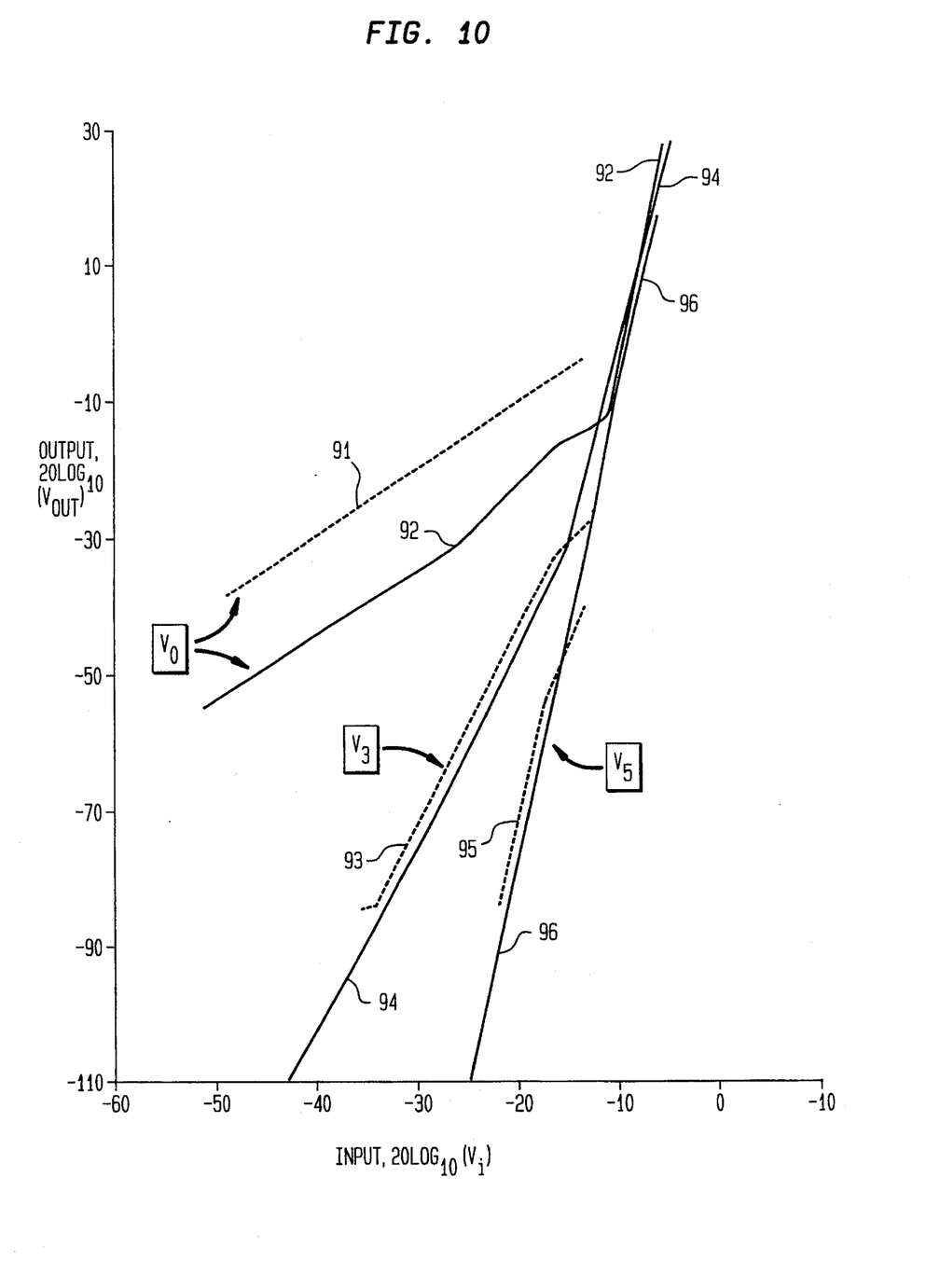
FIG. 10 shows graphs which compare predicted and measured results for a UHF cuber circuit.

Cuber circuit 80 was built using the above-noted HP anti-parallel diode package and tested at 900 MHz. The characteristics of the printed circuit 86 are: capacitors C1, C2 and C3—each 0.1 µF; reverse saturation current of each diode—1.5 nA; bulk resistance $R_b$ of 9 ohms; overall capacitance of 1.2 pF; transit time of 100 ps; ideality factor of 1.11 (i.e., β=34.843/volt at room temperature); shunt resistance $R_p$ of 50 ohms; and inductance of 6 µH for each AC choke 82, 84. Shown in FIG. 10 are the $V_{out}$ versus $V_{in}$ results at 900 MHz for the two-tone input case. Dotted lines 91, 93 and 95 are the measured results for the $V_0$, $V_3$ and $V_5$ components of the output voltage whereas solid lines 92, 94 and 96 represent the predicted results using the above described power series approximation for $V_0$, $V_3$ and $V_5$, respectively. The shown power series curves are generated with a low frequency approximation, which does not include the effects of diode transit time or capacitance. The main effect of operating at UHF is that much of the diode current is shunted by capacitance. Thus to achieve the same non-linear effects of the diodes, it is necessary to pump the cuber with about 9 dB more power than would be the case at low frequencies. Accordingly, the abscissa coordinates of each point in the curves 92, 94 and 96 are shifted by +9 dB for comparison purposes.

In addition, the diode capacitance allows about 15 dB more fundamental signal leak-through than for the low frequency case. This much leak through causes the cuber 80 to have a significant effect on the net gain of the power amplifier 20 of FIG. 1 where it is used for cubic distortion cancellation (typically about 4 to 5 dB). However, by using a small preamplifier (not shown) in the direct path between summer 18 and amplifier 20, it is possible to correct this effect with negligible effect on efficiency, distortion, or dynamic range.

The above described capacitance effects at UHF have been found not to affect the relative strength of the third order output relative to higher order outputs. This assures that the dynamic range of the cuber is about the same at UHF as at low frequency.

Figure 11:
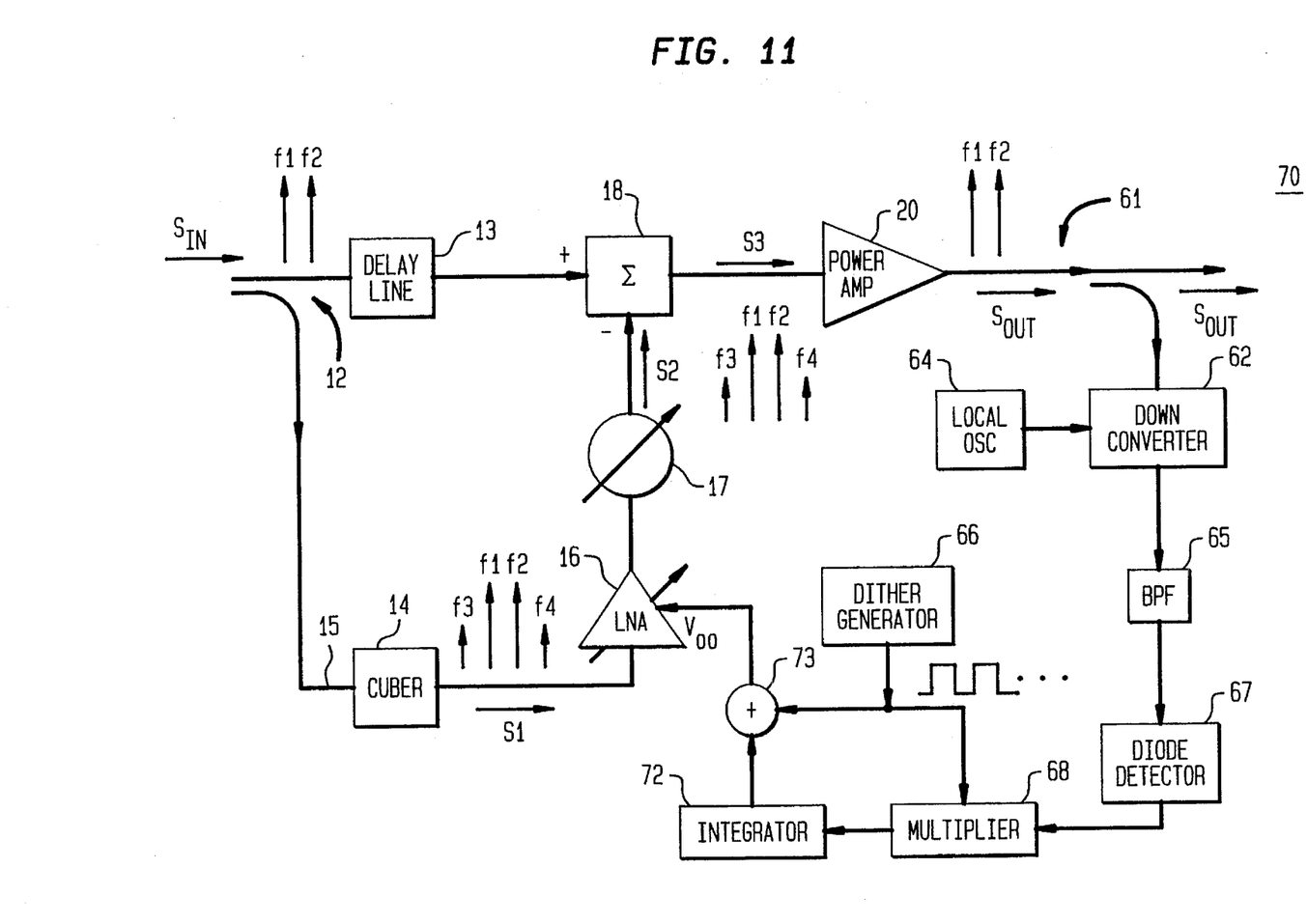
FIG. 11 depicts an alternate embodiment of a low distortion amplifier circuit of the present invention.

Referring now to FIG. 11, another embodiment of a low distortion amplifier circuit according to the present invention is the shown amplifier circuit 70 which includes the components of the previously discussed amplifier circuit 10 in conjunction with additional correction circuitry. Briefly, the correction circuitry is operable to detect IMD energy within output signal $S_{out}$ and to provide a control signal $V_{co}$ to LNA 16 to control its gain in accordance with the IMD energy detected. LNA 16 gain is continuously adjusted to control the third order power level of signal S3 so that the IMD power of $S_{out}$ is always kept at a minimum level.

Continuous correction for maximum IMD cancellation is accomplished by first coupling signal energy or signal $S_{out}$ with directional coupler 61 towards down-converter 62. Local oscillator 64, which is preferably a comb frequency local oscillator, provides an L.O. signal to down converter 62 so that the coupled RF signal is down converted to an intermediate frequency (IF) that is applied to narrow band pass filter (BPF) 65. With filter 65 having a resonant frequency at one of the third order IMD frequencies fc+3γ or fc−3γ (down-converted), only the third order distortion power, and not the fundamental power at fc+γ and fc−γ, passes through filter 65 and is detected by diode detector 67. Detector 67 then produces an error voltage "$V_{err}$" indicative of the unwanted IMD power, which is applied to multiplier 68.

While the use of down-converter 62 in conjunction with the local oscillator 64 is preferable to allow for the use of a low cost, narrow band pass filter 65, it is understood that these components could be eliminated if filter 65 is designed with a resonant frequency at the higher RF frequencies of fc+3γ or fc−3γ. Since narrower filters are generally available at lower IF frequencies, the former approach is, of course, preferable.

Dither generator 66 generates a continuous sequence of voltage pulses, which may be a square wave pulse train. This voltage pulse sequence is applied to multiplier 68 and also to an input port of summer circuit 73. Multiplier 68 multiplies the instantaneous voltage level of the voltage pulse sequence with that of error signal $V_{err}$, to produce a multiplied output signal that is supplied to integrator 72. Integrator 72 then integrates the multiplied output signal over time to provide an integrated output that is supplied to the other input of summer circuit 73. The dither generator voltage pulse sequence is then summed with the integrator output by summer circuit 73 to produce the control voltage $V_{co}$ which controls LNA 16 gain, preferably by controlling the bias voltage therein.

Since the output of integrator 72 is a slowly changing voltage relative to the fast changing dither pulse sequence, each voltage pulse of the sequence will produce an instantaneous change in the error voltage $V_{err}$. With the voltage pulse that produce this change also being applied to the multiplier 68, the change in $V_{err}$ is correlated with the voltage pulse that produced the change. Using this technique, the integrator output voltage will slowly converge to the point at which $V_{err}$, and hence the undesired IMD energy, is reduced below a minimum threshold.

The continuously corrected low distortion amplifier circuit 70 is particularly useful in wireless communications base stations where the used channels are sparsely spaced with respect to frequency. In this application, the filtering by BPF 65 is advantageously performed in the unused channels, where only the intermodulation products appear.

It is understood that other control techniques may be utilized to continuously vary the control voltage $V_{co}$ until the error voltage $V_{err}$ is indicative of minimum intermodulation power in the output signal. For instance, the controlling circuit configuration encompassing dither generator 66, multiplier 68, integrator 72 and summer 73, may be replaced by a microprocessor in conjunction with a sample and hold circuit, A/D and D/A converters, whereby the detected error signal would be sampled and the control voltage $V_{co}$ adjusted in accordance therewith. The microprocessor would be used to control incrementing and decrementing of the voltage $V_{co}$ until it is optimized.

It will be understood that the embodiments described herein are merely exemplary and that one skilled in the art can make many modifications and variations to the disclosed embodiments without departing from the spirit and scope of the invention. All such variations and modifications are intended to be included with the scope of the invention as defined by the appended claims.

What is claimed is:

1. A cuber circuit for converting a time varying input signal into an output signal having at least a third order distortion component, comprising:

an antiparallel diode arrangement including a first diode having a first cathode and a first anode, said first anode being coupled to a first circuit node, and a second diode having a second anode and a second cathode, said second cathode being coupled to said first circuit node;

a biasing circuit arrangement coupled to said antiparallel diode arrangement for causing D.C. bias current to flow through each of said diodes, said biasing circuit arrangement including a first source of D.C. potential between said first cathode and a second circuit node, and a second source of D.C. potential between second anode and said second circuit node;

a load impedance coupled to said antiparallel diode arrangement for extracting signal current therefrom, said load impedance being coupled between said second circuit node and a third circuit node;

said input signal being applied between said first and third circuit nodes to produce said output signal having said third order distortion component across said load impedance.

2. The cuber circuit according to claim 1 wherein said time varying input signal has at least first and second frequency components at frequencies fc−d and fc+d, respectively, where fc is a reference carrier frequency and d is a frequency offset, and said third order distortion component is at frequencies fc−3d and fc+3d.

3. The cuber circuit according to claim 1 wherein said input signal applied to said cuber circuit produces a first signal current i1 flowing through said first diode and a second signal current i2 flowing through said second diode and wherein said output signal is produced by a current i flowing through said output impedance, substantially equal to i1 minus i2.

4. The cuber circuit according to claim 1 wherein said biasing circuit arrangement comprises:

a third source of D.C. potential coupled between first cathode and said second anode;

a first capacitor coupled between said first cathode and said second circuit node;

a second capacitor coupled between said second anode and said second circuit node;

wherein said third source of potential is operable to charge said first and second capacitors to enable said first and second capacitors to function as said first and second sources of D.C. potential, respectively.

5. The cuber circuit according to claim 4 wherein said third source of potential has positive and negative terminals, with said negative terminal connected to ground potential, and wherein said cuber circuit further comprises:

a first AC choke connected between said positive terminal and said second anode; and a second AC choke connected between said first cathode and ground potential.

6. The cuber circuit according to claim 1 wherein said biasing circuit arrangement comprises:
- a first D.C. source having a negative terminal coupled to said first cathode and having a positive terminal coupled to said second circuit node; and
- a second D.C. source having a positive terminal coupled to said second anode and having a negative terminal coupled to said second circuit node.

7. The cuber circuit according to claim 1 wherein said first and second diodes each have an associated bulk resistance and wherein said cuber circuit further includes:
- a circuit arrangement, coupled between said first and third circuit nodes, for supplying said input signal, said circuit arrangement having a source impedance;
- wherein resistance values of said source impedance, said bulk resistance and said load impedance are such as to provide said third order distortion component at a predefined power level relative to the power level of said input signal and relative to the power level of higher order distortion components of said output signal.

8. The cuber circuit according to claim 7, wherein:
- said cuber circuit is operable to provide said output signal with said third order distortion component at a predetermined amplitude level above the noise level within said output signal when said input signal is at a minimum amplitude level Vimin; and
- said cuber circuit is operable to provide the amplitude level of said third order distortion component of said output signal greater than a given amplitude level Y dB above amplitude levels of higher order distortion components of said output signal, when said input signal is between Vimin and a maximum amplitude level Vimax.

9. The cuber circuit according to claim 8, wherein said predetermined amplitude level above the noise level of said output signal is about 10 dB.

10. The cuber circuit according to claim 9 wherein said given amplitude level Y above amplitude levels of higher order distortion components is about 30 dB.

11. The cuber circuit according to claim 8, wherein the maximum voltage Vimax is in accordance with the following equation:

$$(C7/7!)^2 Vimax^{14} + (C5/5!)^2 Vimax^{10} = (C3/3!)^2 Vimax^6/Y,$$

where C3, C5, and C7 are defined by the equation:

$$i = C1 Vi + (C3/3!) Vi^3 + (C5/5!) Vi^5 + (C7/7!) Vi^7 + \ldots$$

where i is the current of said output signal, Vi is the voltage level of said input signal, and C1 is a coefficient that is a function of circuit component values within said cuber circuit.

12. The cuber circuit according to claim 11, wherein the coefficients C1, C3, C5 and C7 are functions of the diode bulk resistance Rb of said first and second diodes, the load impedance $R_L$, a source resistance Rs, a reverse saturation current Io of said first and second diodes, whereby values of $R_L$, Rs, Rb and Io are determinative of Vimax.

13. The cuber circuit according to claim 8, wherein dynamic range between Vimin and Vimax is about 18 dB.

14. The cuber circuit according to claim 1 wherein said input signal is a single tone input and wherein said third order output is the third harmonic of said single tone.

15. A method for amplifying an input signal having at least a first frequency component at a frequency fc−d and a second frequency component at a frequency fc+d, where fc is a reference carrier frequency and d is a frequency offset, comprising:
- splitting said input signal into a cuber input signal and a direct path signal;
- applying said cuber input signal to a circuit arrangement including first and second diodes coupled to one another in an anti-parallel configuration;
- D.C. biasing said first and second diodes to produce a D.C. current flow through each said diode;
- extracting signal current from said anti-parallel diode configuration by means of a load impedance coupled thereto, to thereby provide a cuber output signal having a third order distortion component of a predetermined magnitude at frequencies fc−3d and fc+3d, wherein said load impedance comprises the input impedance of a first amplifier coupled to said circuit arrangement;
- amplifying said cuber output signal with said first amplifier to provide a first amplified signal;
- vectorially combining said direct path signal with said first amplified signal to provide a predistorted signal having said first and second frequency components and said third order distortion component; and
- applying said predistorted signal to a second amplifier to produce an amplified output signal that is substantially devoid of third order distortion components.

16. The method according to claim 15 wherein applying said cuber input signal to said circuit arrangement produces a first signal current i1 flowing through said first diode and a second signal current i2 flowing through said second diode, and wherein said signal current extracted to produce said cuber output signal is substantially equal to i1 minus i2.

17. An amplifier circuit for amplifying an input signal having at least first and second frequency components into an amplified output signal substantially free of intermodulation distortion components, comprising:
- a coupler for splitting said input signal into a direct path signal and a coupled path signal;
- a cuber circuit for converting said coupled path signal into a cuber output signal having at least a third order frequency component, said cuber circuit including: first and second diodes coupled to one another in an anti-parallel configuration; at least one D.C. source for biasing said first and second diodes to produce a D.C. current flow through each said diode; wherein said cuber output signal is extracted from said anti-parallel diode configuration;
- a low noise amplifier (LNA) coupled to said cuber circuit, for amplifying said cuber output signal in a substantially linear manner to provide an amplified cuber output signal;
- a combiner for vectorially combining said direct path signal with said amplified cuber output signal to provide a predistorted signal having said first and second frequency components and said third order component; and
- an output amplifier for amplifying said predistorted signal to produce said amplified output signal substantially devoid of third order distortion components.

18. The amplifier circuit according to claim 17, further comprising:
- a directional coupler for providing a coupled sample of said amplified output signal;
- a bandpass filter coupled to said directional coupler for passing signal power of said coupled sample at at least one intermodulation frequency;

a detector coupled to said bandpass filter for providing an error signal indicative of intermodulation frequency power so passed; and a controlling circuit arrangement for providing a control signal to said LNA, responsive to said error signal, to control gain of said LNA, thereby controlling distortion frequency power within said predistorted signal to reduce said intermodulation frequency power within said amplified output signal.

19. The amplifier circuit according to claim 18, wherein said controlling circuit arrangement comprises:

a dither tone generator for generating a sequence of voltage pulses;

a multiplier for multiplying voltage pulses from said dither tone generator with said error signal to produce a multiplier output signal;

an integrator coupled to said multiplier for integrating said multiplier output signal over time to generate an integrator output signal;

a summing circuit, coupled to said dither tone generator and to said integrator, for summing said integrator output signal with said sequence of voltage pulses to produce said control signal.

20. The amplifier circuit according to claim 19 further comprising:

a local oscillator for providing a local oscillating signal;

a down converter for mixing said coupled sample of said amplified output signal with said local oscillating signal to provide an intermediate frequency (IF) signal, said IF signal being provided to said bandpass filter; and wherein said bandpass filter is operable to pass signal energy at an IF frequency associated with said intermodulation frequency.

* * * * *